United States Patent [19]

Damiano et al.

[11] Patent Number: 5,537,330
[45] Date of Patent: Jul. 16, 1996

[54] METHOD FOR MAPPING IN LOGIC SYNTHESIS BY LOGIC CLASSIFICATION

[75] Inventors: Robert F. Damiano, Hopewell Junction, N.Y.; Anthony D. Drumm, Rochester, Minn.; Michael K. Edwards, Rochester, Minn.; Robert L. Kanzelman, Rochester, Minn.; Kathy M. McCarthy, Rochester, Minn.

[73] Assignee: International Business Machines Corporation, Armonk, N.Y.

[21] Appl. No.: 258,314

[22] Filed: Jun. 10, 1994

[51] Int. Cl.$^6$ .................................................. G06F 17/50
[52] U.S. Cl. .......................................... 364/489; 364/488
[58] Field of Search ................................ 364/488, 489, 364/490, 578; 395/500

[56] References Cited

U.S. PATENT DOCUMENTS

| | | | |
|---|---|---|---|
| 4,703,435 | 10/1987 | Darringer et al. | 364/489 |
| 4,833,619 | 5/1989 | Shimizu et al. | 364/489 |
| 4,882,690 | 11/1989 | Shinsha et al. | 364/490 |
| 4,896,272 | 1/1990 | Kurosawa | 364/491 |
| 4,922,432 | 5/1990 | Kobayashi et al. | 364/490 |
| 4,964,056 | 10/1990 | Bekki et al. | 364/488 |
| 5,003,487 | 3/1991 | Drumm et al. | 364/489 |
| 5,029,102 | 7/1991 | Drumm et al. | 364/489 |
| 5,034,899 | 7/1991 | Schult | 364/488 |
| 5,065,335 | 11/1991 | Yokota et al. | 364/489 |
| 5,150,308 | 9/1992 | Hooper et al. | 364/489 |
| 5,349,659 | 9/1994 | Do et al. | 395/700 |

OTHER PUBLICATIONS

"Pattern Synthesis Sub–System", IBM Technical Disclosure Bulletin, vol. 32, No. 2, Jul. 1989, pp. 50–53.

King et al., "BDDMAP: a technology mapper based on a new covering algorithm", 29th ACM/IEEE Design Automation Conference, 1992 IEEE, Paper 30.2, pp. 484–487.

Trevillyan, "An Overview of Logic Synthesis Systems", 24th AVM/IEEE Design Automation Conference, 1987, Paper 9.1, pp. 166–172.

*Primary Examiner*—Vincent N. Trans
*Attorney, Agent, or Firm*—Keith L. Hargrove; Andrew J. Dillon

[57] ABSTRACT

A method within a logic synthesis system provides for using tags attached to the nodes in a parse string generated from an abstract description of a logic design to classify portions of a heterogeneous design as open control, structure dominant, or direct map. The classification is then used to govern the amount of optimization allowed during logic synthesis. The classification is further used to seed or bypass the covering algorithms to produce the technology implementation desired by the designer. Structure dominance is a technique for "seeding" patterns by a designer which best fit the structure to the technology, which implies that the structural representation of the design as entered by the designer dominates the patterns located by the covering algorithm. However, other pattern matching functions are allowed to find better matches, if they exist, and the covering algorithm is allowed the final choice. Direct map processing bypasses optimization and covering altogether to implement the structural representation exactly as written, if possible, using the available elements in the target technology library. In the event that direct map is not possible, the node is processed as structure dominant.

24 Claims, 9 Drawing Sheets

METHOD FOR MAPPING IN LOGIC SYNTHESIS BY LOGIC CLASSIFICATION

BACKGROUND OF THE INVENTION

1. Technical Field

The invention relates to logic design automation and more particularly to logic synthesis.

2. Glossary of Terms

A Box is the single organizational component of a logic synthesis database. It has input and output terminals, which allow connection to other boxes by nets. Each box is designated by a type, which may be a primitive or may reference a definition in terms of other boxes. Thus, a hierarchy of boxes can be used and an instance of a high-level box type, such as a parity box, may be treated as a single box or expanded. A block is equivalent to a box.

A Component Instantiation implies a block of hierarchy within a design entity containing a unique instance of another section of design defined by another design entity. In VHDL, a component instantiation statement and corresponding specification may be used to define the instance of a gate from a technology library and identify its connections, respectively.

Control Logic tends to be characterized by complex, unpredictable interrelationships of signals. Such logic usually contains a large amount of redundancy, which decreases testability, requires more connections than necessary, increases area and produces long and slow paths.

A Covering Algorithm, sometimes called mapping or technology mapping, is the implementation of a generic Boolean network using a library of technology dependent gates.

Data Flow Logic is characterized by highly parallel and well-known or well-understood combinatorial algorithms, such as adders and multipliers, and may include the most critical timing path for the design.

Expressions are the product of parsing register transfer level statements. They correspond one for one with source level statements and are stored as a string of tokens on a box. They are in prefix form (postfix form would be equivalent), i.e. in the string form of a parse tree. They are commonly vectored and are made of n-ary operators.

Logic Synthesis is used to mean the synthesis of a technology dependent model from a register transfer level description.

A Netlist is a detailed interconnection listing of boxes in the target technology from which automated logic diagrams may be produced for integrated circuit fabrication.

Primitives are technology independent gates, e.g. AND gates, ORs, NOTs, etc.

A Register Transfer Level Description is a high level abstraction of a logic design. It comprises logic functions to be implemented in an integrated circuit. Interface constraints and a technology database may be specified. An example of a language that may be used for RTL description is VHDL.

Structural Dominance is a tool taught by the present invention allowing a logic designer to imply structure in a source language at the Register Transfer Level, which structure may be preserved through synthesis out to a resulting logic design.

Transformation is a term for a collection or suite of programs which operate on expressions or manipulate boxes representing boolean functions and their connections.

3. Description of the Related Art

The design of very large scale integration (VLSI) circuits presents a number of challenges beyond those encountered in the design and development of smaller integrated circuit chips. A longer manufacturing cycle, tighter timing requirements, shorter machine cycle, and a larger number of gates per designer all must be overcome while meeting a short development time budget.

Logic synthesis is a process used to convert a technology independent logic description into a netlist which may be directly implemented in a technology and thereby speed circuit development. Logic synthesis addresses many problems, one of them being the conversion of a more-or-less technology independent register transfer level (RTL) design model to a technology dependent model. Computer programs that perform logic synthesis are known, however these computer programs generally use mathematical techniques that do not have general solutions. Faced with the lack of a rigorous mathematical solution, logic design engineers have had to develop techniques which may not be mathematically rigorous but which do produce acceptable results. Such techniques generally involve compromises and practical limitations. Logic synthesis can also be used to generate a technology dependent model from a very high level (e.g. higher than RTL) description or to convert a technology dependent design to a different technology.

Prior art logic synthesis programs generally operate as follows. The logic synthesis program begins by having the designer describe the desired logic function in a "register transfer level description." The set of register transfer level expressions are then parsed into tokens. Next these tokens are converted to a set of primitive boolean function boxes. Logic reduction transformations are then performed on this global set of primitive boxes.

One problem encountered while synthesizing a design is providing the same level of information to the logic synthesis system as would be available to a human designer. Much of the information available to a designer, however, does not exist in any computer-readable form. Yet, a Register Transfer description contains a great deal of information in the form of the logic structure which could be used by the logic synthesis tool.

Typically, as the RTL description is processed in preparation for logic synthesis, the model is reduced to primitive form, thus destroying most of the structural information contained in the original description. This is done to place fewer restrictions on the logic reduction programs. However, experiments have shown that structural restrictions based on external broad-based knowledge (i.e. global information possessed by the designer and injected into the synthesis system via structure) produce better results.

Compounding the problem of structural information loss, RTL languages are often degraded to a very primitive dyadic form making preservation of the structural information more difficult than for other description forms (graphics descriptions, for example). U.S. Pat. No. 5,029,102 teaches techniques for processing the output of a parser prior to and during the logic synthesis process which have made it possible to preserve the designers original structure to a very large extent. One of the primary benefits this provides is that changes to the synthesized design may be effected in a predictable manner by modifying the original register transfer level description.

What constitutes optimality is not directly quantifiable. An "optimal" logic design for one technology is frequently not an "optimal" design in another technology. Indeed what is optimal in one technology may depend upon the particular application, or overall design, rather than local improvement. However, several factors are generally agreed as being suitable for grading the results of a logic synthesis process. These are: (1) the area of the design (essentially the number of cells or gates); (2) the wireability of the design (related to the number of connections); (3) the timing of the design; and (4) the testability of the design. While all of the above factors affect the perceived quality of the design, they also produce conflicting requirements for the synthesis tool.

Logic synthesis has been perceived as being advantageously applied to control logic portions of a design but not for data flow portions. Designers continue to manually tune data flow logic at a detailed level as a result of designer reluctance to accept the results of the logic synthesis tool. The reason for a distinction between control logic design and data flow logic design is related to distinct properties of these classes and the manner in which they are designed.

In control logic the interrelationship of signals tends to be complex, unpredictable and therefore difficult to optimize manually. Such logic usually contains a large amount of redundancy which decreases testability, requires more connections than necessary, increases area and produces long and slow paths.

Data flow logic designs tend to be highly parallel and usually embody well-known or well-understood combinatorial algorithms such as adders and multipliers. Also, data flow logic often becomes the centerpiece of a design and may contain the most critical timing path for the design. Thus, the designer usually carefully considers the design and typically desires a great deal of control over implementation.

The designer preference for control or determinism in data flow logic may be seen as having driven logic synthesis research toward automation of control logic synthesis. Synthesis systems generally destroy any original structure implied in the RTL description of the design. Determinism and optimization have been generally seen as incompatible. However, J. Bendas, in an article titled "Design Through Transformation", in *Proceedings of the 20th ACM/IEEE Design Automation Conference*, pp. 253–256, June 1983, suggested adding determinism of structure to synthesis. This was accomplished by taking advantage of the fact that synthesis processes generally operate on primitives. Transformation programs which had the most effect on logic structure were bounded, letting only some operations touch basic structural elements, e.g. AND-OR boxes. The results improved mapping because of the increased flexibility given the designer. The structure coming into synthesis was generally being produced by synthesis. The designer gained control over the result not provided by pure synthesis. The approach worked well for some logic. The improved synthesis of dataflow logic frequently proved worth the cost of some loss of optimization of control logic that resulted.

U.S. Pat. No. 5,029,102 also describes a logic synthesis system which operates on a set of register transfer statements describing the desired logic. The statements are parsed to allow logic reduction to be applied on the individual expressions. The expressions as modified by the reduction operation are converted to a set of technology independent boxes (TIBs), representing common boolean functions, such as AND, OR, AND-OR, etc. Logic reduction is then performed on the global set of any remaining primitives.

U.S. Pat. No. 5,029,102 further provides for the manipulation and optimization of expressions contained within boxes. Such expression processing or transformation is used to simplify traversing or changing the expressions. The various operations which may be performed on an expression include: (1) conversion of dyadic operators into n-adic; (2) changing negation operators to their complement; (3) DeMorgan related optimization; (4) Two level function recognition; and (5) Expansions to "normal" logic primitives. Operations are performed on the expressions but not between expression boxes. Expressions are then expanded into TIBs for further synthesis operations.

In order for logic synthesis to reduce the logic design cycle time, it must be applied to all aspects of design, not just control logic. While simple mapping tools and improved design entry tools, for example schematic capture, can reduce the time for a designer to enter or change a low level design, there remains a significant amount of effort for designers using such tools and they do not bring all of the possible advantages of applying logic synthesis to all aspects of a design problem.

U.S. Pat. No. 5,029,102 provides more control to the designer while allowing the tool some flexibility in its implementation of the design. This overcomes some designer reluctance to apply logic synthesis to data flow logic design.

However, it is desirable to give still more control to the designer over the results of synthesis. At the same time logic synthesis is given some freedom to optimize results where structural control is used. Finally, the designer should be able to mix tight control, loose control and unencumbered logic synthesis over different parts of an implementation.

SUMMARY OF THE INVENTION

It is an object of the invention to provide a method of automated logic design.

It is another object of the invention to provide a method of logic synthesis.

It is a still further object of the invention to provide a selectable level of user control over technology implementation for different portions of a logic system.

The above and other objects of the invention are provided for by a logic synthesis system in which a logic designer is given more control over the results of synthesis when desired, while synthesis is allowed reign for optimization of the results otherwise. Regions of tight and loose control may be mixed within a single logic model. A method within a logic synthesis system provides for using tags attached to the nodes in a parse string generated from an abstract description of a logic design to classify portions of a heterogeneous design as open control, structure dominant, or direct map. The classification is then used to govern the amount of optimization allowed during logic synthesis. The classification is further used to seed or bypass the covering algorithms to produce the technology implementation desired by the designer. Structure dominance is a technique for "seeding" patterns by a designer which best fit the structure to the technology, which implies that the structural representation of the design as entered by the designer dominates the patterns located by the covering algorithm. However, other pattern matching functions are allowed to find better matches, if they exist, and the covering algorithm is allowed the final choice. Direct map processing bypasses optimization and covering altogether to implement the structural representation exactly as written, if possible, using the available elements in the target technology library. In the event that direct map is not possible, the node is processed as structure dominant.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Overview

Figure 1:
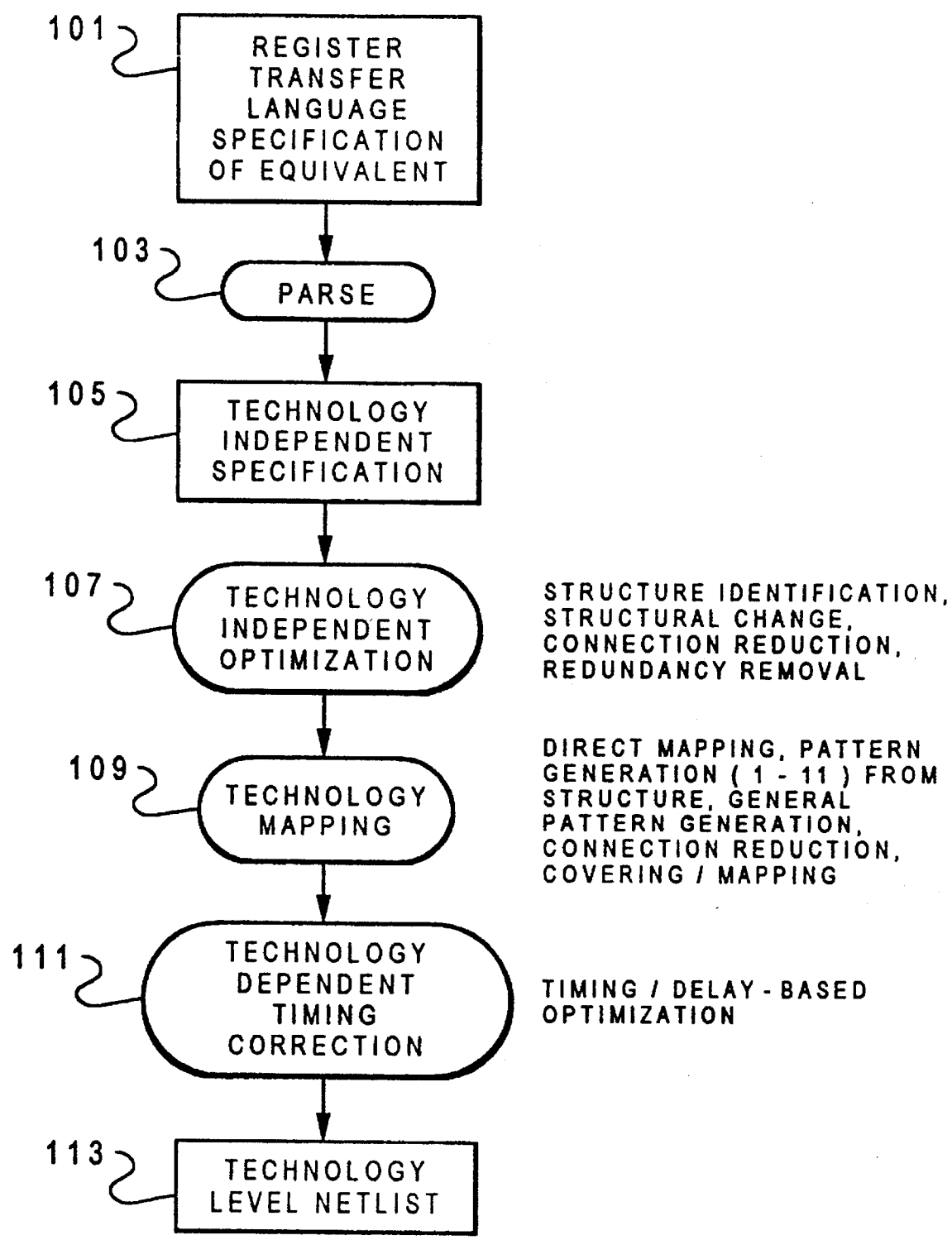
FIG. 1 illustrates a logic synthesis process.

FIG. 1 generally illustrates a logic synthesis process. Logic synthesis begins with a register transfer language description 101 or equivalent expression of a logic design supplied by a designer. Next, the description 101 is run through a parse operation 103 to produce a technology independent specification 105. Specification 105 is typically expressed in a node graph where nodes are boxes and the graph represents signals propagated between boxes. Next, block 107 represents transformation operation such as technology independent optimization done on the nodes. For structure dominance tagged boxes, this includes structure identification. For open control tagged boxes, this includes structural change. Connection reduction and redundancy removal also occur at this stage. Next, block 109 indicates technology mapping or implementation. This includes direct mapping, pattern generation from structure, general pattern generation, further connection reduction and covering. Block 111 represents technology dependent timing correction and timing optimization. The final product is a technology level netlist 113. The invention relates primarily to steps 107 and 109.

Designer Input of High Level Description

Three levels of control are available to a designer through register transfer level statements or direct specification of a box. A box corresponds to a logical operation (either simple or complex) which in turn relates an output signal (which may be vectored) to a plurality of input signals. The box may correspond to an assignment expression in an RTL description. The box corresponds to a node in a graph for the logic synthesis internal model. A box may have an attribute specified by the designer at the high level design stage for a design control class for logic synthesis. Values for the attribute include a first value specifying open control class (generally taken as corresponding to control logic), a second value specifying structure dominance (generally taken as corresponding to data flow logic) and a third value specifying direct mapped logic. Where no attribute is specified, one of the above values serves as a default. Absence of such specification may be to simplify design entry where the design is primarily of one form or the other.

Examples are used to demonstrate a VHDL Mechanism which may be used to provide the specification of attributes. The examples are not the only way a user is able to use these techniques. The examples also help summarize the entire process from VHDL to technology netlist.

Expression Processing

Expressions that are processed in logic synthesis can be thought of as one box per VHDL source-level statement. The expression is stored as a string of tokens on the box. They are in prefix form (the string form of a parse tree), commonly vectored and are made up of n-ary operators. A procedural interface is used to simplify traversing or changing the expressions. Various operations may be performed on the expression as previously described.

Per the present invention, the various parts of expression processing are separated so that they may be applied independently to each box. Operations are performed on the expressions but not between boxes. Expressions are then expanded into technology independent building blocks (TIB) for further synthesis operations. Operations which produce two-level operators (sometimes called group operators) are used only for structure dominance and direct map operations. Two-level operators include such gate arrangements as AND-ORs, OR-ANDs, AND-NORs and OR-NANDS, which lend structure to the design and limit the scope of the logic optimization operations.

Boxes having the attribute for open control, e.g. control logic, are expanded to primitives to allow maximum scope to the logic synthesis tool. Expansions on boxes inherit as attributes the attribute for the box for the original design statement so that later operations may discern the class of logic encountered.

Open Control

Figure 2:
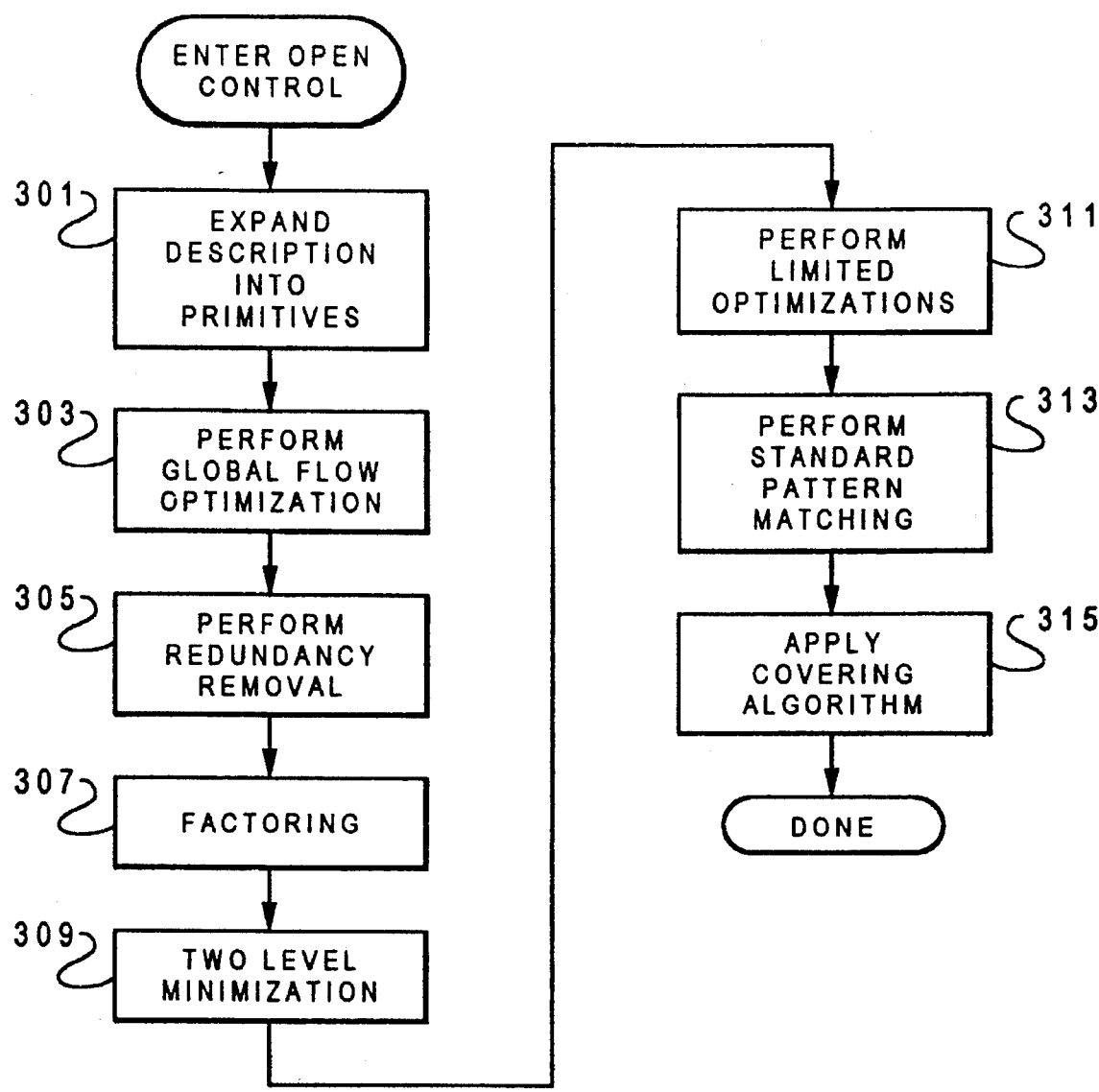
FIG. 2 is a flow chart for technology independent optimization and technology mapping of expressions labeled for open control.

Open control is in essence the exercise of no control by the designer after making a register transfer level description. Logic synthesis is free to employ all known optimization techniques in the art. As illustrated in FIG. 2, the abstract description is expanded directly to a graph expressed in boolean primitives (step 301). The graph of the primitives may then be subjected to global flow optimization (step 303), redundancy removal (305), factoring (step 307), and two-level minimization (step 309) and other limited optimizations (step 311). Steps 301–309 correspond to step 107 in FIG. 1. After optimization, standard pattern matching (step 313) and application of the covering algorithm occur (step 315). Steps 311, 313 and 315 correspond to step 109 in FIG. 1.

Structure Dominance

Structured TIB boxes (again typically for data flow logic) produced by expression processing may be tagged by an attribute for preservation of structure or for specific optimization as exemplified by the VHDL handling mechanism. The attributes inhibit certain technology independent optimization (e.g. global factoring) on tagged boxes. While technology independent optimization does not work on tagged boxes, it can still work through the tagged boxes, since the boolean function of the box is still known.

When technology mapping or covering is performed, the tagged boxes have been preserved and are available as seeds to the covering process. An example of such a covering process which may be advantageously employed with the invention was taught in an article by D. S. Kung, et al., "BDDMAP: A Technology Mapper Based on a New Covering Algorithm" presented at the 29th ACM/IEEE Design Automation Conference (1992). This covering method has two important parts, (1) pattern matching, and (2) covering. Pattern matching is used to find patterns in the box graph which match various technology primitives. Many such patterns typically exist and they are stored (added to the box) during structure dominance operation without making a decision as which should be used. The covering algorithm then traverses the graph and uses technology data (area and speed, for example) to find an optimal cover.

Structure preservation assures that the overall structure of a design remains nearly intact as logic optimization is applied. Structure dominance is a technique of allowing "seeding" patterns by a designer which best fit the structure to the technology. This implies that the structural representation of the design, as entered by the designer, dominates the patterns located by the covering algorithm, but does not force the mapping decision. Other pattern matching functions are allowed to find better matches, if they exist, and the covering algorithm may be allowed final choice.

Seeding is performed by a "suite" of structure dominance transformation programs. These programs find corresponding matches using the target technology and build patterns which are then passed along to the covering process. The transformations are illustrated by the flow chart of FIG. 3.

Upon entering technology mapping (corresponding to step 109 in FIG. 1) for expressions tagged for structure dominance, step 401 is executed to order the boxes from most to least complex. Next, at step 403 a box is taken from the ordered list for transformation processing. All exact matches in the target technology for the function of the box are located. Next, at step 405 it is determined if any exact matches were found. If no exact matches were found, the box is reduced via step 407 in such a way as to allow exact matching (for example by reducing fan-in) and the pattern including the expansion is added to the box. Step 431 provides for determining if any reduced fan-in matches were located. If not, processing goes to step 411. If yes, step 433 is executed to build a pattern including the match and the fan-in tree and add it to the box. Processing then continues with step 411.

If exact match patterns were located for the unexpanded box, step 409 is executed instead to add these patterns to the box. After step 409, step 411 provides for determining if a box has a complement in the target technology. If it does, step 413 provides for examining fan-out from the box. At step 415 it is determined if the fan-out is a single inverter. If it is, the complement of the pattern is added to the inverter (step 419). If the fanout is not a single inverter step 417 provides for building a pattern including the complement and the inverter and adding the pattern to the box.

Following the NO branch from step 411 or after either of steps 417 or 419, step 421 expands the box to the next lower level of complexity while maintaining all added patterns. For example an adder is expanded into an exclusive OR (for the sum) and an AND-OR (for the carry out). Next, step 423 determines if all boxes in the ordered list have been processed and if not, returning processing to step 403.

Once all boxes have been processed, step 425 provides for performing limited optimization on the graph. Next, step 427 provides for standard pattern matching to further optimize the graph. Last, step 429 represents a call to the covering algorithm to produce a technology specific netlist.

Structure Dominance Example

The use of structure dominance for a logic synthesis operation can lead to substantially different end results. This example is designed to illustrate such a situation. Table 1 provides a register transfer level description of a logic design in terms of input signals A, B, C and D; intermediate signals T and U; and output signals F and G.

TABLE 1

| Attribute LOGIC_STYLE of L1: label is DOMINANT; | |
|---|---|
| L1: Block begin | |
|     T < = A xor B xor C; | (1) |
|     U < = (A and B) or (A and C) or (B and C); | (2) |
|     F < = T or (not A and not C and D); | (3) |
|     G < = U or (A and D); | (4) |
| end block; | |

Figure 5:
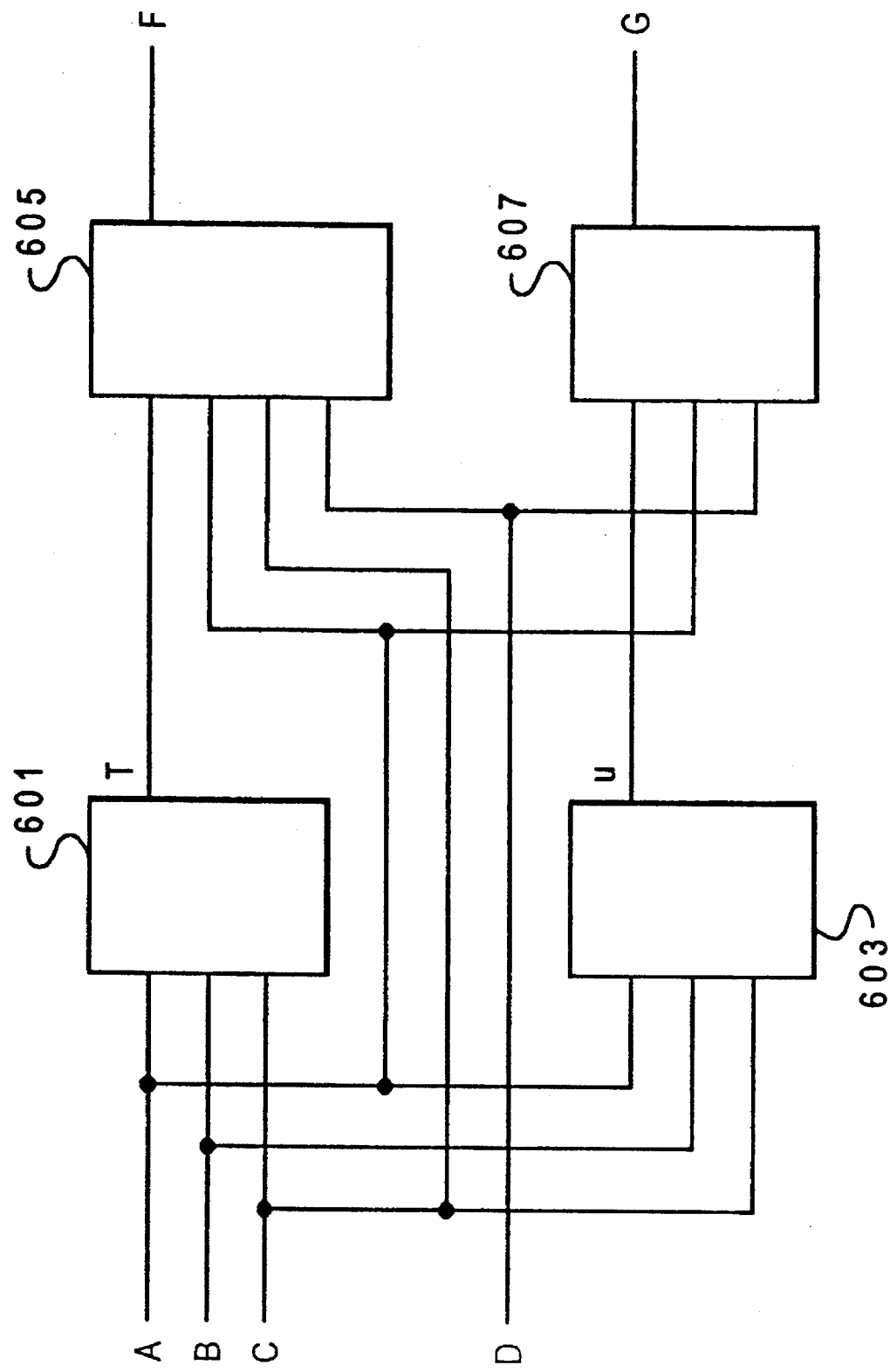
FIG. 5 is an expression level graph generated from a register transfer level description for a logic design.

FIG. 5 is an expression level graph of expressions 1–4 from TABLE 1. Expression 1 is represented by box 601 which takes signals A, B and C as inputs and provides signal T as an output. Expression 2 is represented by box 603 which also takes signals A, B and C as inputs and provides signal U as an output. Expression 3 is replaced by box 605 which takes signals T, A, C and D as inputs and provides signal F as an output. Expression 4 is replaced by box 607 which takes signals U, A and D as inputs and provides signal G as an output.

Figure 6:
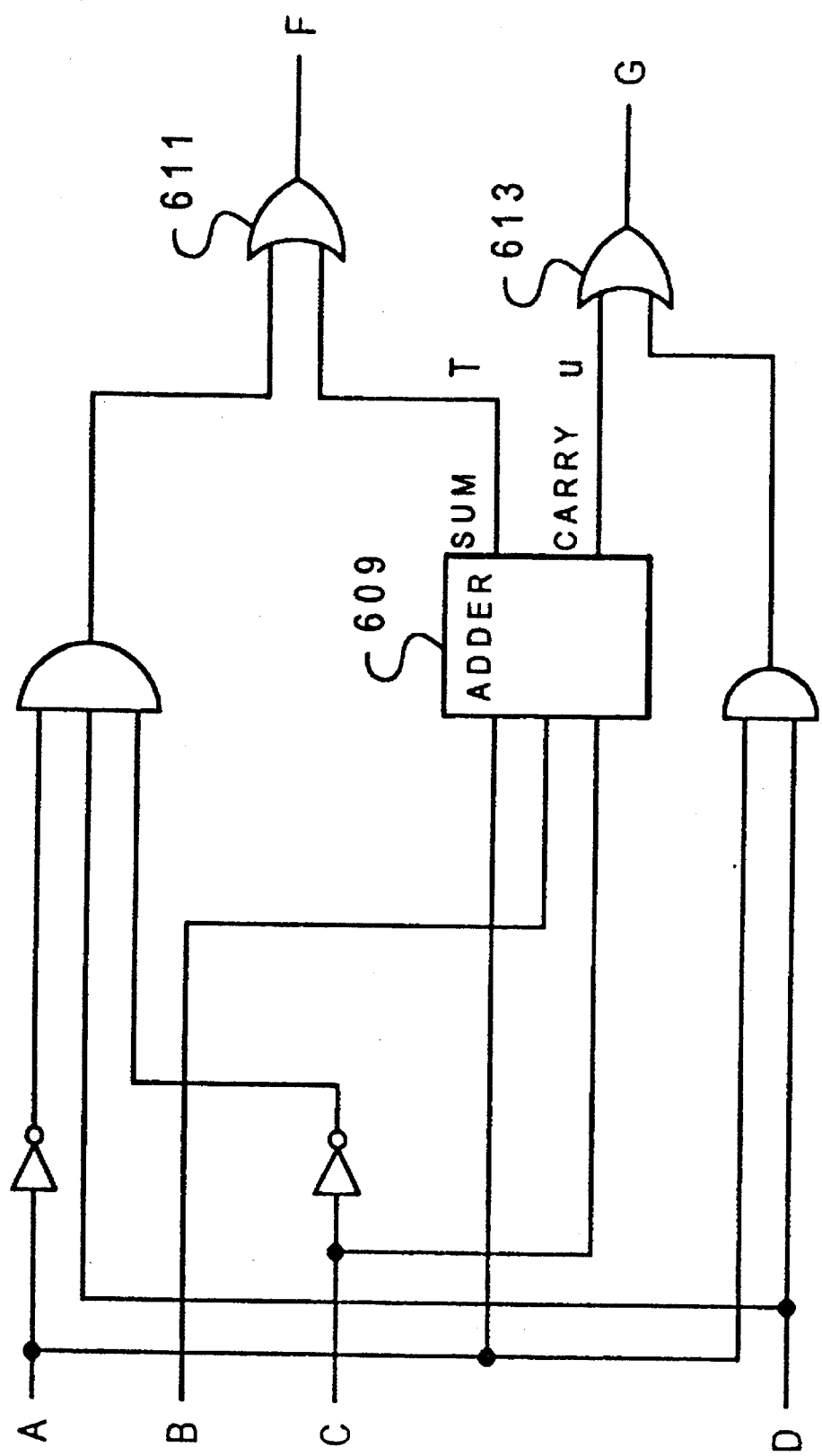
FIG. 6 is a possible implementation for the expression level graph of FIG. 5 in a target technology.

FIG. 6 is a logic diagram of a result desired by the designer upon synthesis in a target technology. The logic synthesis illustrated in the figure generates output signals F and G as required by the register transfer level description. The target technology includes an adder, an instance 609 of which is shown taking signals A, B and C as inputs and generating sum and carry outputs which are applied to OR gates 611 and 613, respectively. Gates 611 and 613 generate the desired output signals F and G. The synthesis of FIG. 6 has 7 elements, including two and gates, two or gates, two inverters and the adder.

Figure 7:
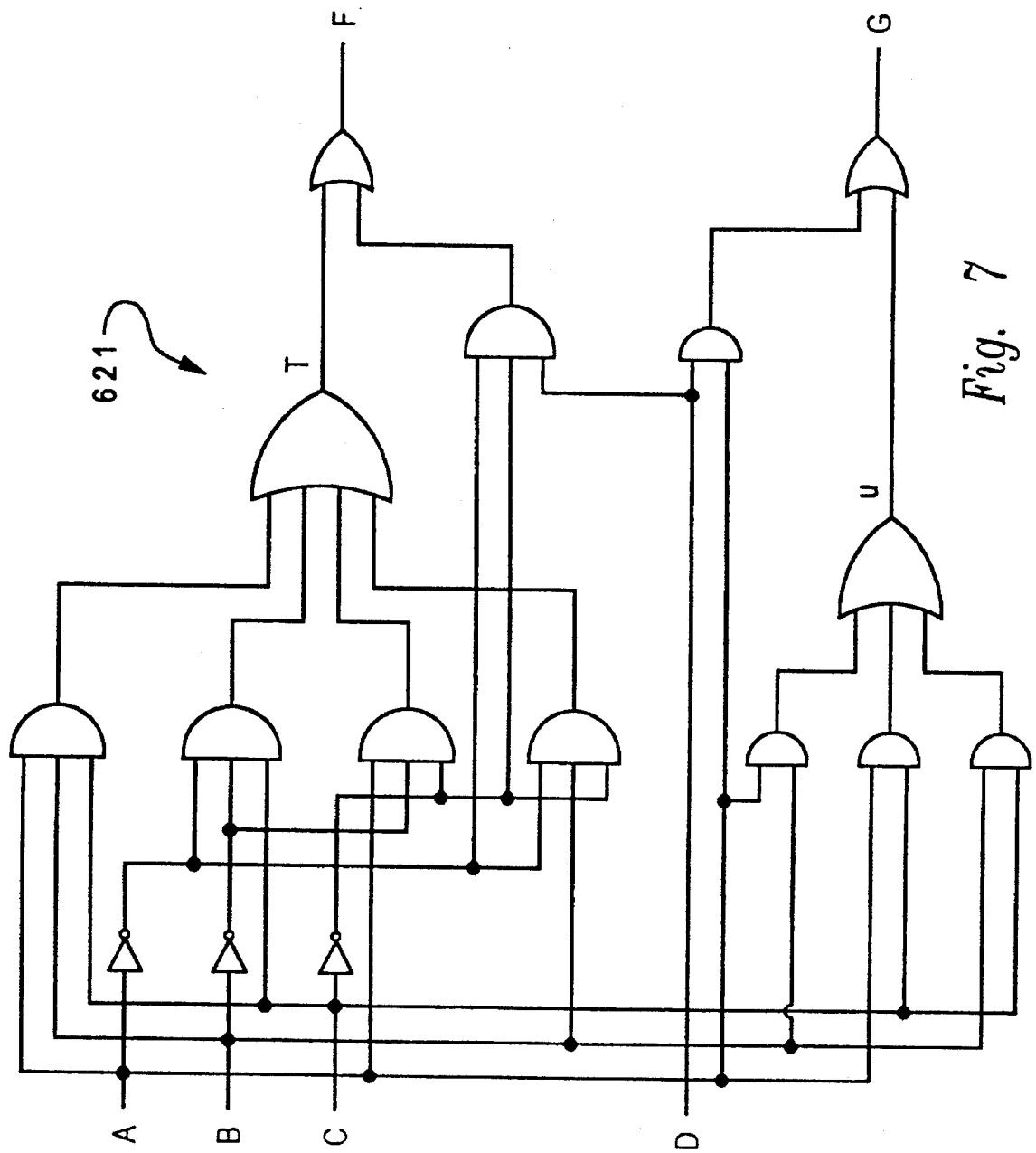
FIG. 7 is a graphical depiction of a netlist generated from the expression level graph of FIG. 5 by a conventional logic synthesis operation using an unconstrained expansion.

FIG. 7 is a graph 621 of an unconstrained expansion of the expression level graph of FIG. 5. Intermediate signals T and U are preserved in the unconstrained expansion.

Figure 8:
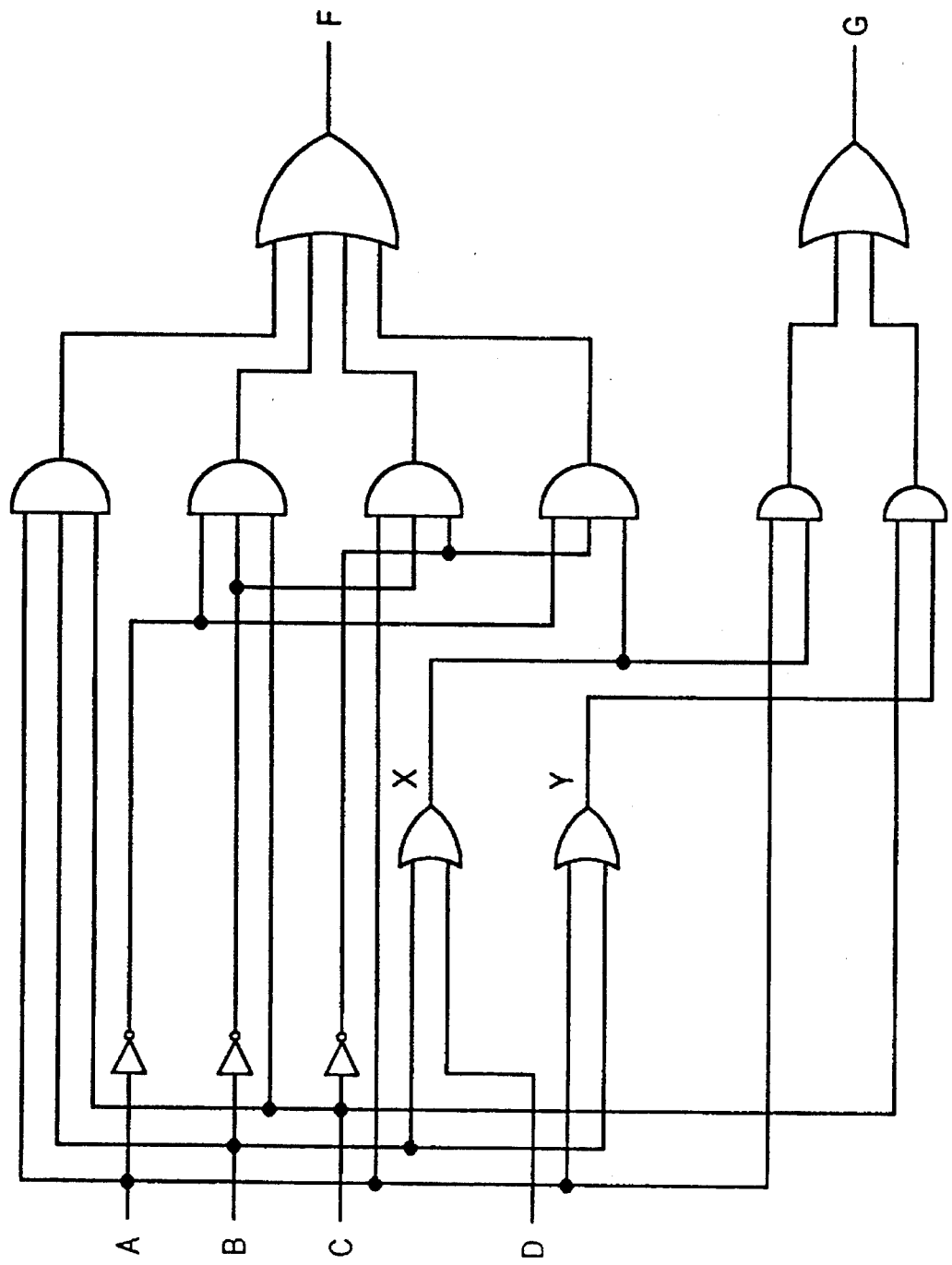
FIG. 8 is a graphical depiction of a netlist after conventional automated optimization of the graph of FIG. 7.

FIG. 8 is an optimization of graph 621 of FIG. 7. The problem raised by the optimization is that it is now very difficult to introduce the adder provided by the target technology. Intermediate signals T and U have been lost and the exclusive or operation is buried. Accordingly, a mapping from the graph to an adder is unlikely to be recognized by the covering algorithm.

Figure 3:
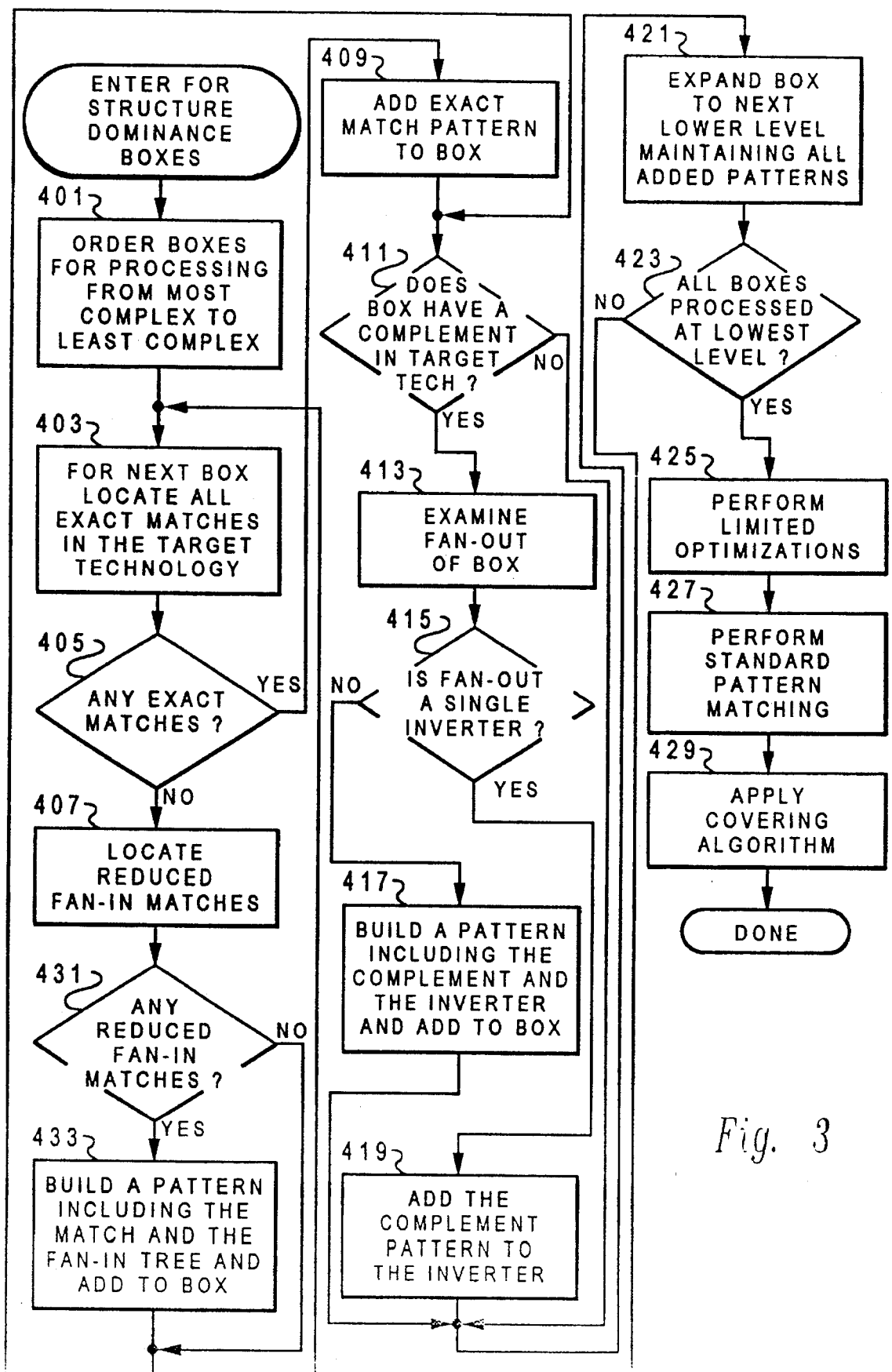
FIG. 3 is a flow chart for technology independent optimization and technology mapping of expressions labeled for structure dominance.
Figure 9:
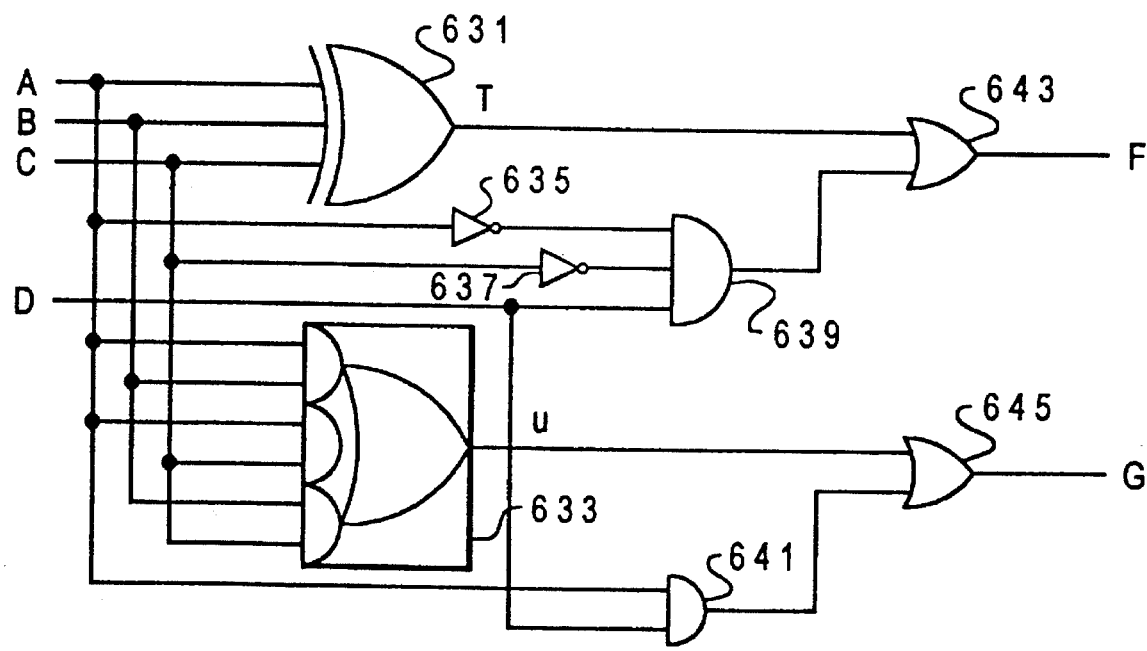
FIG. 9 is a graphical depiction of a structure dominance expansion on the register transfer level description for the logic design.

FIG. 9 represents a structure dominance expansion of the expressions of Table 1 using the process described in FIG. 3. Of particular interest here are the expansion of box 601 of FIG. 5 into EXCLUSIVE OR (X-OR) gate 631 and the expansion of box 603 into an assembly of three AND gates and one OR gate in box 633. Further expansion of boxes 631 and 633 is prevented. Inverters 635 and 637, AND gates 639 and 641, and OR gates 643 and 645 may be optimized at this point. XOR gate 631 and box 633 may be combined to form the adder provided by the technology.

Direct Mapping

Direct mapping operation is very similar to structure dominance operation and may be considered an extension of structure dominance providing still more designer control of the final technology implementation. In brief, rather than adding patterns for technology matches, mapping is performed immediately. The covering algorithm is given no choice. Structure may however be adjusted if no exact matches are found.

In direct mapping, instead of building patterns and adding them to boxes for possible use by the covering algorithm, a suite of mapping programs operate on the tagged boxes to immediately map the boxes to appropriate elements in the target technology. The programs also build the appropriate fan-in trees if necessary. If no match for a box in the target technology data base is found, then the suite of programs for the structure dominance operation may be run as a secondary operation.

The covering algorithm ignores directly mapped boxes. The directly mapped boxes may contain designer added attributes to influence timing correction to work for the designer. For example, the user may specify which of several equivalent technology gates is to be used. There are also attributes to select the techniques used to repower heavily loaded signals by preferring parallel cloning, serial buffering, or inhibiting fan-out repowering altogether. Such attributes are maintained in a manner similar to that which was used to mark boxes for either structure dominance or direct mapping. An integer keyword is used to tag the box. Programs which do not operate on tagged boxes use the existence of this keyword to identify a box as one to be passed over. For programs which do operate on marked boxes the keyword is interpreted as a string of bits with each bit indicating different directives.

Figure 4:
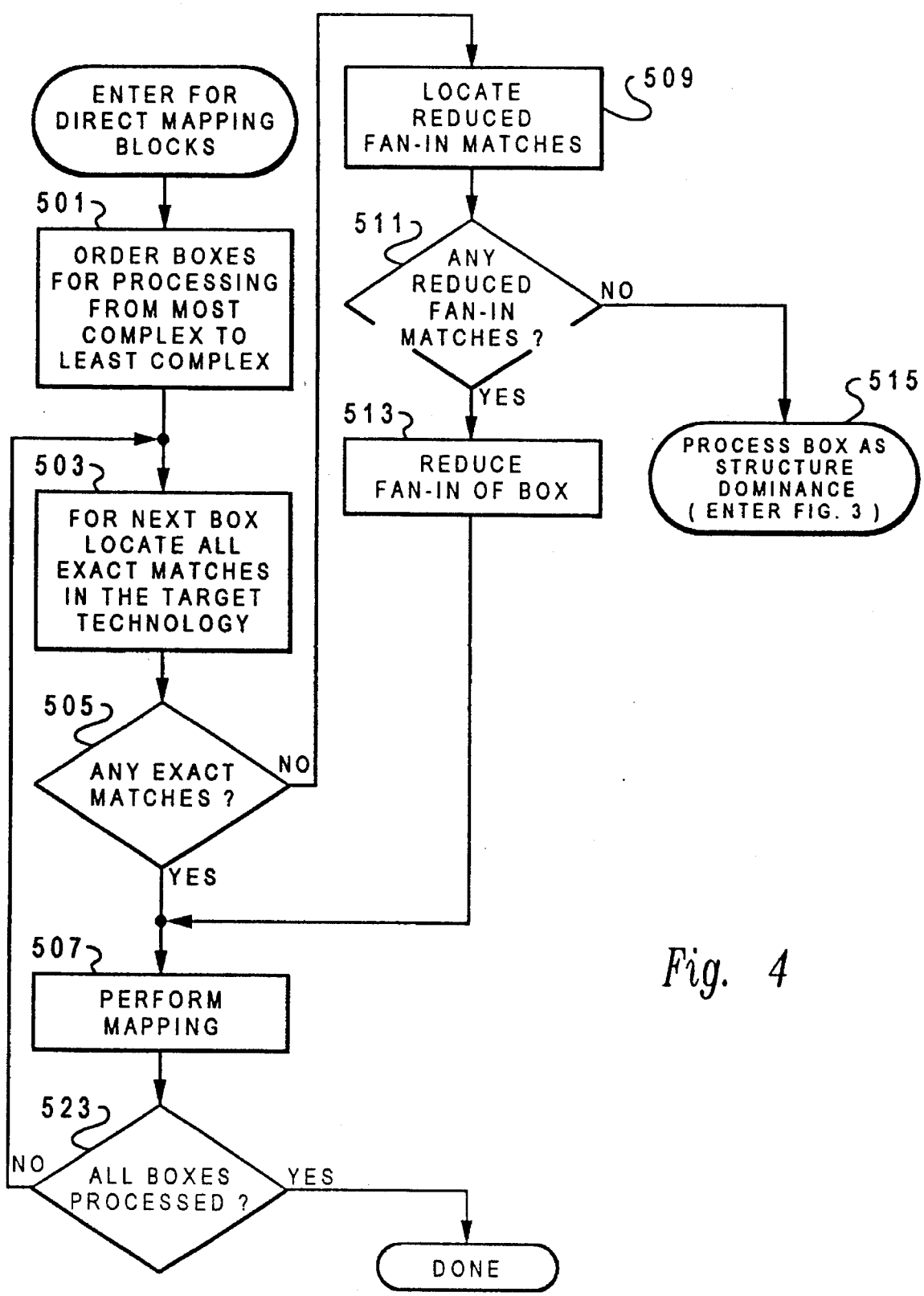
FIG. 4 is a flow chart for technology independent optimization and technology mapping of expression labeled for direct mapping.

Direct mapping precedes structure dominance operations. In this way, if no direct technology mapping can be found, the structure dominance method may be applied to the abstract description. For instance, suppose a designer specifies an AND-OR for direct mapping, but the technology has no such cell, but only AND-NORs. Application of the structure dominance operation will find such a close match and either include an inverter or apply the match to an inverter fed by the subject box. The transformations for Direct mapping are illustrated by the flow chart of FIG. 4.

Upon entering technology mapping (step 109) for expressions tagged for direct mapping, step 501 is executed to order the boxes from most to least complex. Next, at step 503 a box is taken from the ordered list for transformation processing. All exact matches in the target technology for the function of the box are located. Next, at step 505 it is determined if any exact matches were found. If exact matchings were located step 507 is executed instead to direct map the box. After step 507, step 523 is executed to determine if all boxes in the ordered list have been processed. If not, processing returns to step 503.

Following the NO branch from step 505, step 509 provides for locating any reduced fan-in matches. If any were located, they are detected at step 511. Following an affirmative determination, step 513 provides for reducing fan-in of the box and processing is advanced to step 507 for mapping, If no reduced fan-in matches were found, the NO branch is taken from step 511 to step 515, which indicates processing of the box under structure dominance as provided by the process of FIG. 3.

A Direct Mapping Example

In some situations it is desirable to describe very explicitly the low level gates and interconnections used to implement a logic network. Such a situation would be a portion of a design that is under extremely tight timing constraints such that the designer has already performed detailed manual analysis of the critical paths and knows exactly the implementation necessary to meet the constraints. Another such situation would be if the synthesis system can not be made through normal means to produce acceptable implementation for a portion of a design, perhaps because the synthesis system does not have some vital information available to it, such as the effects of physical placement and wiring. The designer may choose to circumvent the optimization and covering performed by the synthesis system to get the desired results.

Direct mapping provides a very detailed level of control over the final low level technology implementation without requiring the source description to make explicit references to elements in the target technology as would be the case for component instantiation. Therefore the source description need not become dependent on the existence of a technology package or library for either synthesis or simulation. In addition, the design source can be resynthesized to a different target technology without modification.

TABLE 2

Direct Mapping VHDL Example

Attribute LOGIC_STYLE of L2: label is DIRECT;
Attribute CAP_LIMIT of L3: label is "1.5";
Attribute REPOWER of L3: label is PARALLEL;
L2: Block begin
   X < = (A and B and C) or (D and E);    (1)
   L3: Y < = not (X or F);    (2)
   end block:

In this example, X is a signal that assigned the result of an AND-OR expression of inputs A, B, C, D, and E as shown. Signal Y is assigned the result of the NOR of the intermediate signal X and input signal F. The LOGIC_STYLE attribute on label L2 of the block containing these expressions marks them both for direct mapping. The CAP_LIMIT and REPOWER attributes on label L3 put additional restrictions on the NOR expression to further guide the timing correction processing within the synthesis system, as will be discussed below. Note that the signals may be bit vectors of any width.

Figure 10:
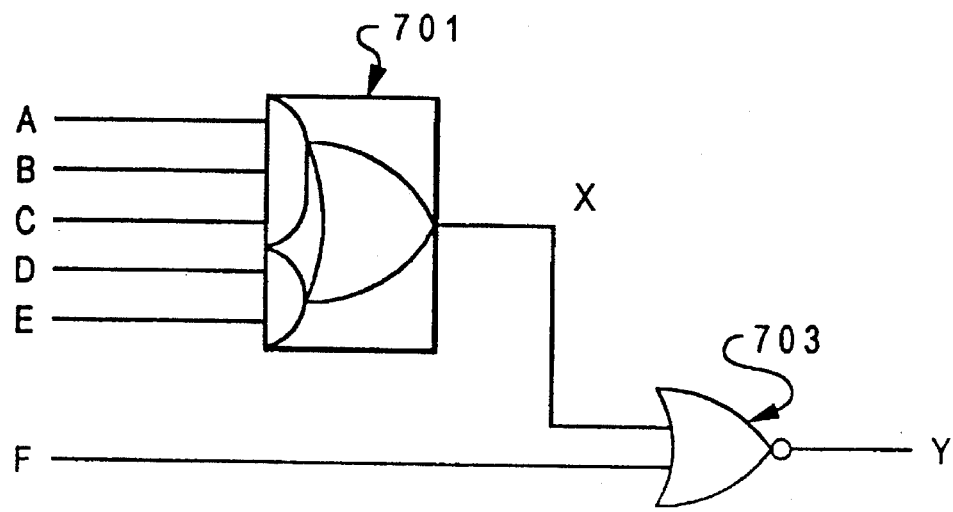
FIG. 10 represents a direct mapping expansion of an expression level graph.

FIG. 10 represents a direct mapping expansion of the expression level graph created from expressions 1 and 2. Box 701 represents the AND-OR function of expression 1 and box 703 represents the NOR function of expression 2. Further expansion and all optimization of either of these boxes is prevented. The direct mapping programs will attempt to immediately map the boxes to appropriate elements in the target technology. For example, the AND-OR mapping program will first attempt to map box 701 to an available technology gate that exactly implements the 3×2 AO function represented by box 701. However, suppose that the target technology does not have such a gate. The AND-OR mapping program would then attempt to map box 701 to a smaller AND-OR gate by building the appropriate fan-in tree(s), in this case a 2 input AND gate feeding a 2×2 AO gate. If the target technology does not have a 2×2 AO gate either, box 701 is reclassified and is treated as structure dominant. Box 703 is processed in a similar manner by the NOR mapping program.

After the boxes have been direct mapped to the target technology, the synthesis system can use any additional attributes to control the operation of the timing correction processing. For example, once box 703 has been mapped to a primitive in the target technology, the CAP_LIMIT and REPOWER attributes are used to control the loading and repowering of signal Y. The CAP_LIMIT attribute instructs synthesis to limit the physical capacitive load being driven by the NOR gate to 1.5 units (e.g. 1.5 picoFarads) by repowering signal Y. Furthermore, the REPOWER attribute instructs synthesis to perform this repowering by making parallel copies of the NOR gate instead of alternate techniques, such as inserting inverters or buffers in series.

It is important to differentiate between direct mapping and component instantiation. Direct mapping, with the operations described here, allows portability of the design among technologies whereas component instantiation links a design irrevocably to a particular technology. Even if detailed technology information is specified, the logic synthesis tool can ignore instructions if they are not supported by the technology database.

Conclusion

Logic models are generally not exclusively dataflow or control logic systems. The present invention allows such a mixture of logic classes in the same model to be effectively synthesized. Tradeoffs are not required since different logic classes can be partitioned within the abstract description.

While the invention has been particularly shown and described with reference to a preferred embodiment, it will be understood by those skilled in the art that various changes in form and detail may be made therein without departing from the spirit and scope of the invention.

What is claimed is:

1. A method of logic synthesis using a computer, comprising:

providing a plurality of register transfer statements describing a target logic system within said computer;

tagging selected register transfer statements within said computer to specify a plurality of directed control levels including an open level and a structure dominance level;

parsing the plurality of register transfer statements to generate a node graph where a node corresponds to a register transfer statement and allowing each node to receive an attribute indicating a directed control level;

transforming the nodes having the attribute indicating the structure dominance level by searching a target technology book for exact match patterns to the nodes and adding any exact match patterns located to the nodes;

optimizing the node graph on the nodes having an attribute indicating the open control level and through the nodes having the attribute indicating the structure dominance level; and covering the optimized node graph using the nodes having the attribute indicating the structure dominance level.

2. The method of logic synthesis of claim 1, wherein the step of transforming the nodes having the attribute indicating the structure dominance level further includes: after searching for exact matches for a node, determining if any exact matches were located;

if no exact matches were found for a node, expanding the node to allow location of exact matches and adding the exact match patterns to the node;

searching the technology book for complements to the exact matches for each node;

if a node has a complement, adding a complement pattern to the node; and expanding all nodes while maintain all added exact match patterns and complement patterns.

3. The method of logic synthesis of claim 2, wherein the plurality of directed control levels further include a direct mapping level.

4. The method of logic synthesis of claim 3, and further comprising:

prior to transforming the nodes having the attribute indicating the structure dominance level, transforming the nodes having the attribute indicating the direct mapping level; and if direct mapping for a node fails, transforming the node as though it had the attribute for the structure dominance level.

5. The method of logic synthesis of claim 4, wherein if direct mapping and structure dominance level transforming steps fail to generate any matches, unconstrained technology mapping at the open control level is permitted thereby rendering the register transfer level statements describing the target logic system technology independent.

6. The method of logic synthesis of claim 4, wherein the step of transforming the nodes having the attribute indicating direct mapping further comprise:

searching a target technology library for exact matches to the nodes and mapping any exact matches located to the nodes;

after searching for exact matches for a node, determining if any exact matches were located; and if no exact matches were located for a node, expanding the node by reducing fan-in to allow location of exact matches and adding the exact matches to the node.

7. The method of synthesizing logic as set forth in claim 3, and further comprising:

responsive to user selection, adding attributes to a directly mapped box for controlling timing optimization by said computer system.

8. An apparatus for performing logic synthesis comprising:

attribute identifiers which may be attached to a register transfer level statement;

a parser for converting a plurality of register transfer level statements to a node graph, wherein nodes correspond to register transfer statements which preserve attributes associated with the attribute identifiers;

means for segregating the nodes by attribute into structure dominance nodes and open control nodes;

a plurality of transform means for operating on the structure dominance nodes;

a plurality of transform and optimization means for operating on the open control nodes and any structure dominance nodes not successfully transformed by the plurality of transform means; and means for covering the transformed nodes.

9. The logic synthesis apparatus of claim 8, further comprising:

an attribute identifier for marking a register transfer level statement for direct mapping of nodes; and a plurality of transform means for operating on nodes preserving the nodes tagged for direct mapping;

the plurality of transform means for operating on the structure dominance nodes being further effective for transforming the directly mapped nodes if not transformed by the transform means for direct mapping; and the plurality of transform and optimization means for operating on the open control nodes being further operative on any directly mapped nodes not successfully transformed by any of the transform programs for structure dominance.

10. A method of synthesizing logic comprising the steps performed by a data processing system of:

responsive to user selection of particular technology, tagging register transfer level statements for the technology within said data processing system;

parsing an abstract description of a logic design in tagged register transfer level statements into a node graph wherein nodes correspond to register transfer statements and include attributes relating to the tags which specify a degree of optimization allowed on the nodes;

segregating the nodes for transformation operations based upon attribute values;

transforming the nodes; and covering the transformed nodes to produce a netlist.

11. The method of synthesizing logic as set forth in claim 10, wherein the step of transforming begins with the nodes which are allowed the least optimization.

12. The method of synthesizing logic as set forth in claim 11, and further comprising:

if no exact technology match can be made on a node during the step of transforming, increasing the level of optimization permitted on the node.

13. The method of synthesizing logic as set forth in claim 10, and further comprising:

responsive to user selection, adding attributes to the directly mapped nodes for controlling timing optimization.

14. A method of performing logic synthesis, comprising:

providing a plurality of register transfer statements describing a target logic system;

tagging selected register transfer statements to specify a plurality of directed control levels including an open level and a structure dominance level;

parsing the plurality of register transfer statements to generate a node graph where a node corresponds to a register transfer statement and allowing each node to receive an attribute indicating a directed control level;

transforming the nodes having the attribute indicating the structure dominance level by searching a target technology book for exact match patterns to the nodes and adding any exact match patterns located to the nodes;

optimizing the node graph on the nodes having an attribute indicating the open control level and through the nodes having the attribute indicating the structure dominance level; and covering the optimized node graph using the nodes having the attribute indicating the structure dominance level.

15. The method of logic synthesis of claim 14, wherein the step of transforming the nodes having the attribute indicating the structure dominance level further includes:

after searching for exact matches for a node, determining if any exact matches were located;

if no exact matches were found for a node, expanding the node to allow location of exact matches and adding the exact match patterns to the node;

searching the technology book for complements to the exact matches for each node;

if a node has a complement, adding a complement pattern to the node; and expanding all nodes while maintain all added exact match patterns and complement patterns.

16. The method of logic synthesis of claim 15, wherein the plurality of directed control levels further include a direct mapping level.

17. The method of logic synthesis of claim 16, and further comprising:

prior to transforming the nodes having the attribute indicating the structure dominance level, transforming the nodes having the attribute indicating the direct mapping level; and if direct mapping for a node fails, transforming the node as though it had the attribute for the structure dominance level.

18. The method of logic synthesis of claim 17, wherein if direct mapping and structure dominance level transforming steps fail to generate any matches, unconstrained technology mapping at the open control level is permitted thereby rendering the register transfer level statements describing the target logic system technology independent.

19. The method of logic synthesis of claim 17, wherein the step of transforming the nodes having the attribute indicating direct mapping further comprise:

searching a target technology library for exact matches to the nodes and mapping any exact matches located to the nodes;

after searching for exact matches for a node, determining if any exact matches were located; and if no exact matches were located for a node, expanding the node by reducing fan-in to allow location of exact matches and adding the exact matches to the node.

20. The method of synthesizing logic as set forth in claim 16, and further comprising:

responsive to user selection, adding attributes to a directly mapped box for controlling timing optimization.

21. A method of synthesizing logic comprising the steps of:

responsive to user selection of particular technology, tagging register transfer level statements for the technology;

parsing an abstract description of a logic design in tagged register transfer level statements into a node graph wherein nodes correspond to register transfer statements and include attributes relating to the tags which specify a degree of optimization allowed on the nodes;

segregating the nodes for transformation operations based upon attribute values;

transforming the nodes; and covering the transformed nodes to produce a netlist.

22. The method of synthesizing logic as set forth in claim 21, wherein the step of transforming begins with the nodes which are allowed the least optimization.

23. The method of synthesizing logic as set forth in claim 22, and further comprising:

if no exact technology match can be made on a node during the step of transforming, increasing the level of optimization permitted on the node.

24. The method of synthesizing logic as set forth in claim 21, and further comprising:

responsive to user selection, adding attributes to the directly mapped nodes for controlling timing optimization.

* * * * *